US008604696B2

(12) United States Patent
Lin et al.

(10) Patent No.: US 8,604,696 B2
(45) Date of Patent: Dec. 10, 2013

(54) PLASMA EXCITATION MODULE

(75) Inventors: Tung-Ying Lin, Kaohsiung (TW);
Ming-Hsien Ko, Chiayi County (TW);
Hui-Ta Chen, Taichung (TW);
Chun-Hao Chang, Kaohsiung County (TW)

(73) Assignee: Industrial Technology Research Institute, Hsinchu (TW)

( * ) Notice: Subject to any disclaimer, the term of this patent is extended or adjusted under 35 U.S.C. 154(b) by 632 days.

(21) Appl. No.: 12/456,438

(22) Filed: Jun. 16, 2009

(65) Prior Publication Data
US 2010/0156300 A1    Jun. 24, 2010

(30) Foreign Application Priority Data

Dec. 23, 2008 (TW) ............................... 97150317 A

(51) Int. Cl.
H01J 7/24 (2006.01)
(52) U.S. Cl.
USPC ................................. 315/111.21; 315/111.51
(58) Field of Classification Search
USPC ......... 315/111.51, 111.21, 111.01; 118/723 I, 118/723 IR, 715, 723 E, 723 ER, 723 DC; 156/345.33, 345.34, 345.48, 345.49
See application file for complete search history.

(56) References Cited

U.S. PATENT DOCUMENTS

| | | | | |
|---|---|---|---|---|
| 5,589,737 A * | 12/1996 | Barnes et al. | ............ | 315/111.21 |
| 5,622,606 A | 4/1997 | Kugler et al. | | |
| 5,716,451 A * | 2/1998 | Hama et al. | .................. | 118/723 I |
| 5,907,221 A * | 5/1999 | Sato et al. | ................. | 315/111.51 |
| 5,944,901 A * | 8/1999 | Landes et al. | ............ | 118/723 ER |
| 6,136,140 A * | 10/2000 | Ishii et al. | ................. | 156/345.48 |
| 6,360,686 B1 * | 3/2002 | DeOrnellas et al. | ....... | 118/723 E |
| 6,868,800 B2 | 3/2005 | Moroz | | |
| 7,079,085 B2 | 7/2006 | Lee et al. | | |
| 7,976,674 B2 * | 7/2011 | Brcka | ....................... | 156/345.48 |
| 2004/0173157 A1 * | 9/2004 | Han et al. | ....................... | 118/715 |
| 2008/0050537 A1 * | 2/2008 | Godyak | ......................... | 427/575 |
| 2009/0236447 A1 * | 9/2009 | Panagopoulos et al. | ...... | 239/548 |

FOREIGN PATENT DOCUMENTS

| | | |
|---|---|---|
| JP | 2003-109798 | 4/2003 |
| TW | 449107 | 8/2001 |
| TW | 462207 | 11/2001 |
| TW | 506232 | 10/2002 |
| TW | I222097 | 10/2004 |
| TW | 200510565 | 3/2005 |
| TW | 200644047 | 12/2006 |
| TW | 200845186 | 11/2008 |

OTHER PUBLICATIONS

"Office Action of Taiwan Counterpart Application", issued on Apr. 29, 2013, p. 1-7, in which the listed references were cited.

\* cited by examiner

*Primary Examiner* — Jimmy Vu
(74) *Attorney, Agent, or Firm* — J.C. Patents

(57) ABSTRACT

A plasma excitation module including a chamber, a plurality of coils and a multi-duct gas intake system is provided. The chamber has a dielectric layer. The coils are disposed at an outer side of the dielectric layer, and the coils are separated from each other by an interval and in parallel connection. The multi-duct gas intake system surrounds the dielectric layer and is communicated with the chamber.

17 Claims, 16 Drawing Sheets
(6 of 16 Drawing Sheet(s) Filed in Color)

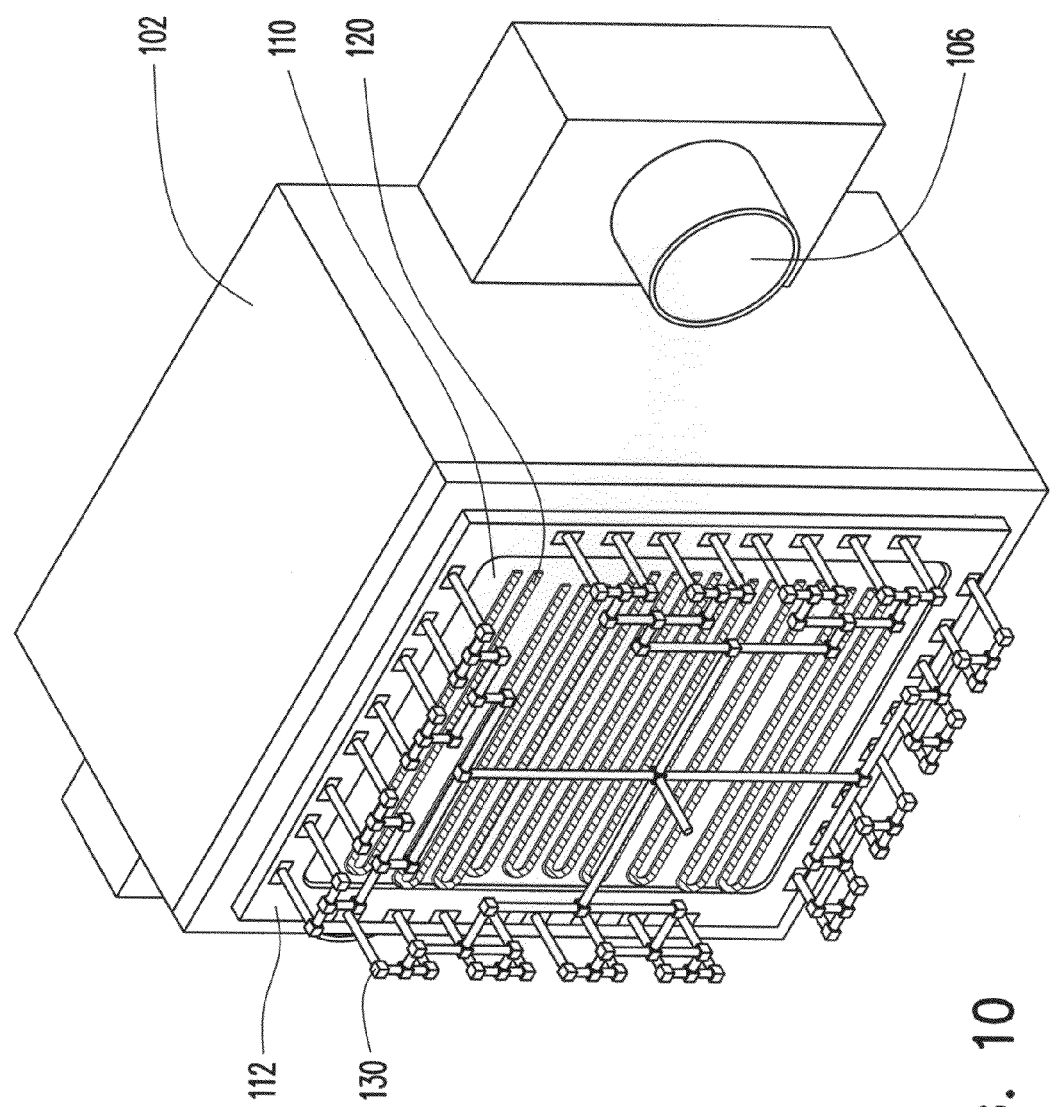

PLASMA EXCITATION MODULE

CROSS-REFERENCE TO RELATED APPLICATION

This application claims the priority benefit of Taiwan application serial no. 97150317, filed Dec. 23, 2008. The entirety of the above-mentioned patent application is hereby incorporated by reference herein and made a part of this specification.

BACKGROUND OF THE INVENTION

1. Field of the Invention

The present invention generally relates to a plasma excitation module, and more particularly, to an inductively coupled plasma excitation module (ICP excitation module).

2. Description of Related Art

Plasma is an ionized gas, which contains ions or electrons and free radicals. The plasma gets broad applications today. As one of the various applications thereof, the plasma processing commonly refers to convert gas into plasma, so as to deposit a plasma gas onto a substrate or to use a plasma gas for cleaning, coating, sputtering, plasma chemical vapour deposition (plasma CVD), ion implanting, ashing or etching. When a common plasma processing equipment is running, a powerful electric field is established between two electrodes, so that a process gas fed between the two electrodes is ionized or dissociated to produce the plasma.

In terms of the development situation of displays today, the main targets are focused on the research and application development of large-scaled displays and flexible displays, wherein the most important issue in the commercial course thereof is about the high uniformity of a large-scaled substrate. The capacitively coupled plasma (CCP), as the conventional technique, has been limited to a low plasma density, so that the processing rate of the plasma equipment fails to be effectively increased. As an alternative, the ICP becomes a technique with highly-potential perspective. Due to the high plasma density produced by the ICP, the ICP is also termed as a high-density plasma source, which features employing a plurality of inductively coupled coils for producing plasma. However, the ICP for a large-scaled substrate encounters following problems: (1) a standing wave effect occurs due to the excessive length of the coils, which reduce the efficiency of transmitting energy; (2) the plasma uniformity is hard to be adjusted, particularly at the edge of the coil, in a large-scaled design, and thereby the ununiformity easily makes a great impact on a plasma film deposition or on a plasma etching process.

To solve the above-mentioned problems, in a patent of TW 00449107, it is proposed that the coils are embedded in a dielectric layer, wherein the dielectric layer is disposed in a chamber and located opposite to a substrate chuck. By adjusting the figure of the dielectric layer, the coupling intensity of electric field is desirably changed. However, the scheme provided by the patent requires sintering an appropriate dielectric material to install the coils. In addition, an additional cooling device is required to dissipate the heat of the coils embedded in the dielectric material, which results in a high cost. Since the coils are embedded in the dielectric layer, an equipment adjustment during the testing is quite inconvenient. In terms of the fabrication process of a large-scaled substrate, it is difficult to sinter a large-scaled dielectric layer or to embed the coils.

U.S. Pat. No. 6,868,800 proposes another scheme where the coils have a specific geometry figure, i.e., a symmetric structure including a plurality of major and minor branches. Although the scheme is able to avoid the standing wave effect caused by excessive length of the coils, but the complexity of the coil geometry figure requires a highly increased processing accuracy which results in the fabrication difficulty and the high production cost. In addition, the gas-supplying system is a single side gas-feeding device, which is suitable only for a low atmospheric pressure situation where a diffused state of gas molecules can be easily realized and the plasma density is accordingly more uniform.

U.S. Pat. No. 7,079,085 proposes a new design of the coils in a way of parallel connection and interlaced disposition to each other, where the plasma uniformity is increased by employing two complementary coils. As a matter of fact, the coil is double-loops coil including two winded wires, and every coil is adjacent and parallel to one another. The single-loop coil herein has a power end and a ground end, wherein the power end and the ground end are adjacently disposed. Since two coils build a structure of parallel connection, so that a less general impedance of the coils is obtained. It should be noted that since the adjacent two coils are parallel and interlaced to each other every a distance length and the current flowing directions in the two coils are opposite to each other, a current complementary function is expected, which is advantageous in balancing the distribution of the electric field. The scheme of said coils rests in complexity of fabricating the coils for large-scaled applications and inconvenience of installation thereof.

SUMMARY OF THE INVENTION

Accordingly, the present invention is directed to a plasma excitation module able to produce a uniform plasma distribution.

The present invention provides a plasma excitation module, which includes a chamber, a plurality of coils and a multi-duct gas intake system. The chamber has a dielectric layer. The coils are disposed at an outer side of the dielectric layer of the chamber, and every coil is disposed in parallel connection. The multi-duct gas intake system surrounds the dielectric layer and is communicated with the chamber.

Based on the described above, the plasma excitation module of the present invention uses the electrode coils in parallel connection for the large-scaled design in association with the multi-duct gas intake system. Both the uniformity of the electromagnetic field and the uniformity of the gas flow field are improved, which results in a uniform plasma density and increased uniformities of forming film or etching process.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee. The accompanying drawings are included to provide a further understanding of the invention, and are incorporated in and constitute a part of this specification. The drawings illustrate embodiments of the invention and, together with the description, serve to explain the principles of the invention.

FIG. 10 is a 3-dimensional diagram showing the bottom portion of a plasma excitation module according to another embodiment of the present invention.

DESCRIPTION OF THE EMBODIMENTS

Figure 1:
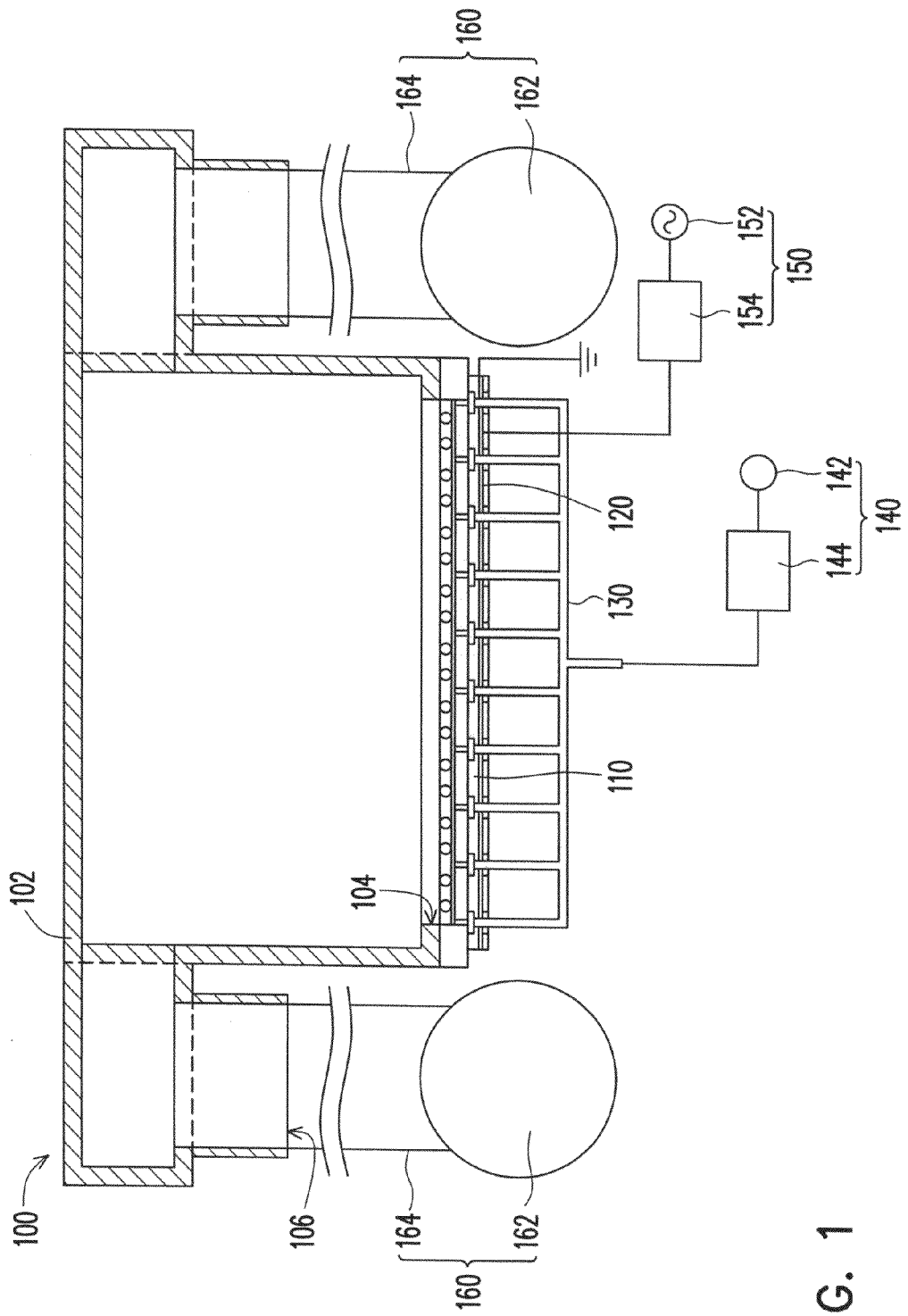
FIG. 1 is a sectional diagram of a plasma excitation module according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the following, the depicted embodiments together with the included drawings are intended to explain the feasibility of the present invention, wherein a same notation or a similar notation is for marking the same or the similar portions. Note that the diagrams are simplified and not in an accurate scale to the real objects. In addition, some of expression words hereinafter regarding direction or orientation, such as 'up', 'down', 'front', 'behind', 'left', 'right', 'inside', 'outside', and the like, are intended to describe, not to limit, the present invention.

FIG. 1 is a sectional diagram of a plasma excitation module according to an embodiment of the present invention.

Referring to FIG. 1, a plasma excitation module 100 includes a chamber 102, a plurality of coils 120 and a multi-duct gas intake system 130. The chamber 102 has a dielectric layer 110, which is, for example, disposed at the lower portion of the chamber 102 and covers an opening 104. The coils 120 are disposed at an outer side of the dielectric layer 110, and each of the coils 120 is separated from each other by an interval and is connected with each other in parallel. The multi-duct gas intake system 130 surrounds the dielectric layer 110 and is communicated with the chamber 102.

In an embodiment, the plasma excitation module 100 further includes a gas-supplying system 140, a power supply system 150 and a vacuum pumping system 160. The gas-supplying system 140 connects the multi-duct gas intake system 130 for providing a process gas such as nitrogen gas, argon gas or other appropriate gases into the chamber 102. The gas-supplying system 140 includes a gas source 142 and a mass flow controller (MFC) 144, wherein the MFC 144 is disposed between the multi-duct gas intake system 130 and the gas source 142.

The power supply system 150 is connected to the coils 120 so as to feed a high-frequency voltage to the coils 120 to produce an electromagnetic field. The power supply system 150 includes a high-frequency power source 152 and an impedance matching circuit 154, wherein the impedance matching circuit 154 is disposed between the coils 120 and the high-frequency power source 152 to reach higher power transmission efficiency.

The vacuum pumping system 160 is communicated with a gas-pumping port 106 of the chamber 102, so that the air or gas in the chamber 102 can be pumped out to form a vacuum state in the chamber 102. The vacuum pumping system 160 includes a vacuum pump 162 and an exhaust pipe 164, wherein the exhaust pipe 164 is disposed between the gas-pumping port 106 of the chamber 102 and the vacuum pump 162. In the embodiment shown in FIG. 1, the plasma excitation module 100 takes, for example, a structure of exhausting at both sides, which means two gas-pumping ports 106 respectively disposed at both sides of the chamber 102 and respectively connected to the vacuum pumping system 160, but it should not be adopted for limiting the scope of the present invention.

In an embodiment of the present invention, the plasma excitation module 100 uses the vacuum pump 162 to pump the air out of the chamber 102 until the barometric pressure gets stable. After that, the gas source 142 is turned on and a mass flow is set by the MFC 144. The process gas is supplied by the gas source 142 and flows into the chamber 102 through the MFC 144 and the multi-duct gas intake system 130. Once the barometric pressure of the supplied gas in the chamber 102 gets stable, the high-frequency power source 152 is turned on to supply a high-frequency voltage. The high-frequency voltage with assistance of the impedance matching circuit 154 is applied to the coils 120 fixed at the outer side of the dielectric layer 110 so as to produce an electromagnetic field. The electromagnetic field due to the inductance of the coils 120 acts upon the gas in the chamber 102 and drives electrons to collide the neutral particles of the process gas, which makes the gas ionized and thereby produces plasma with uniform density in the chamber 102.

Figure 2:
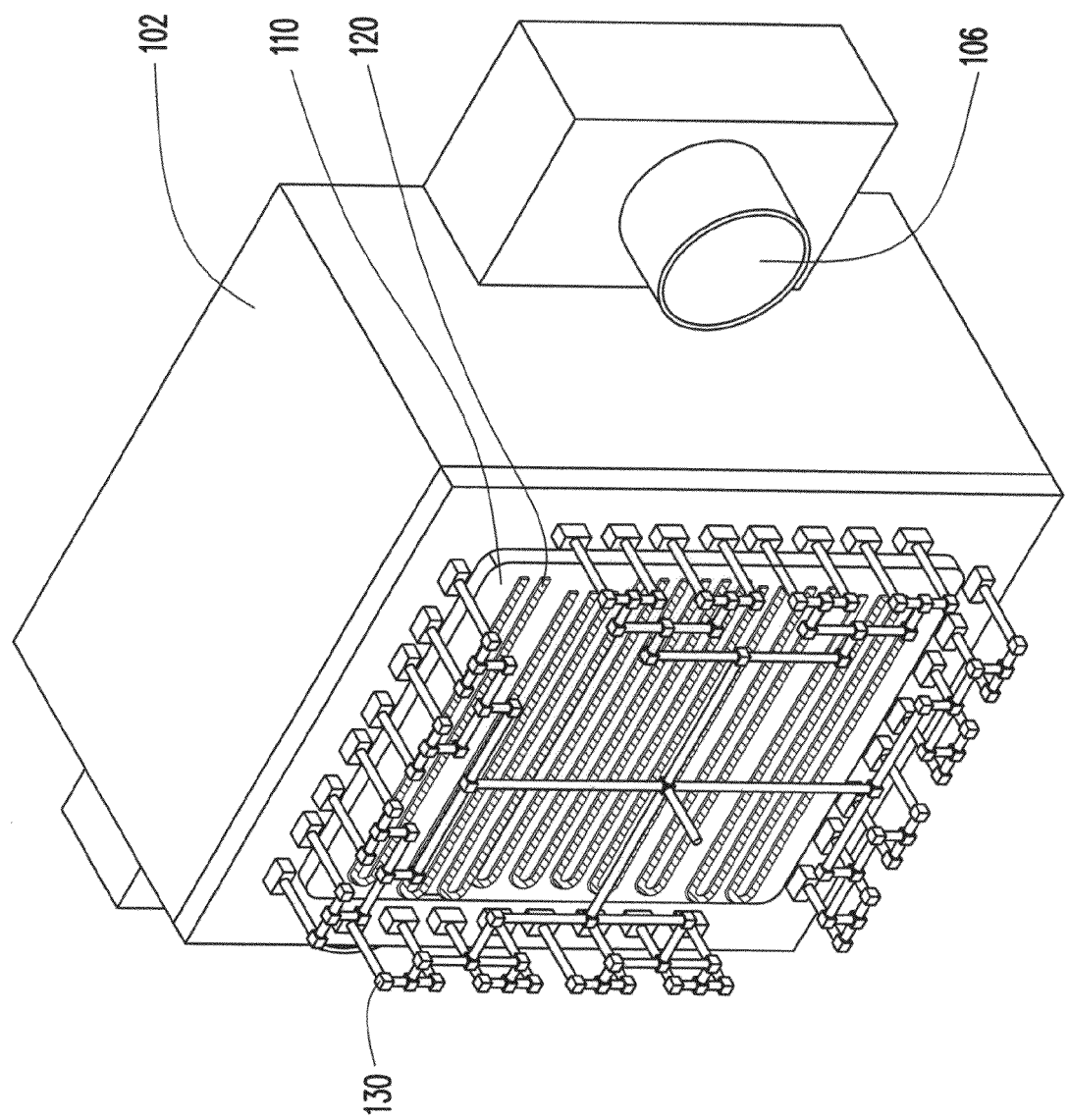
FIG. 2 is a 3-dimensional diagram showing the bottom portion of a plasma excitation module according to an embodiment of the present invention.
Figure 3:
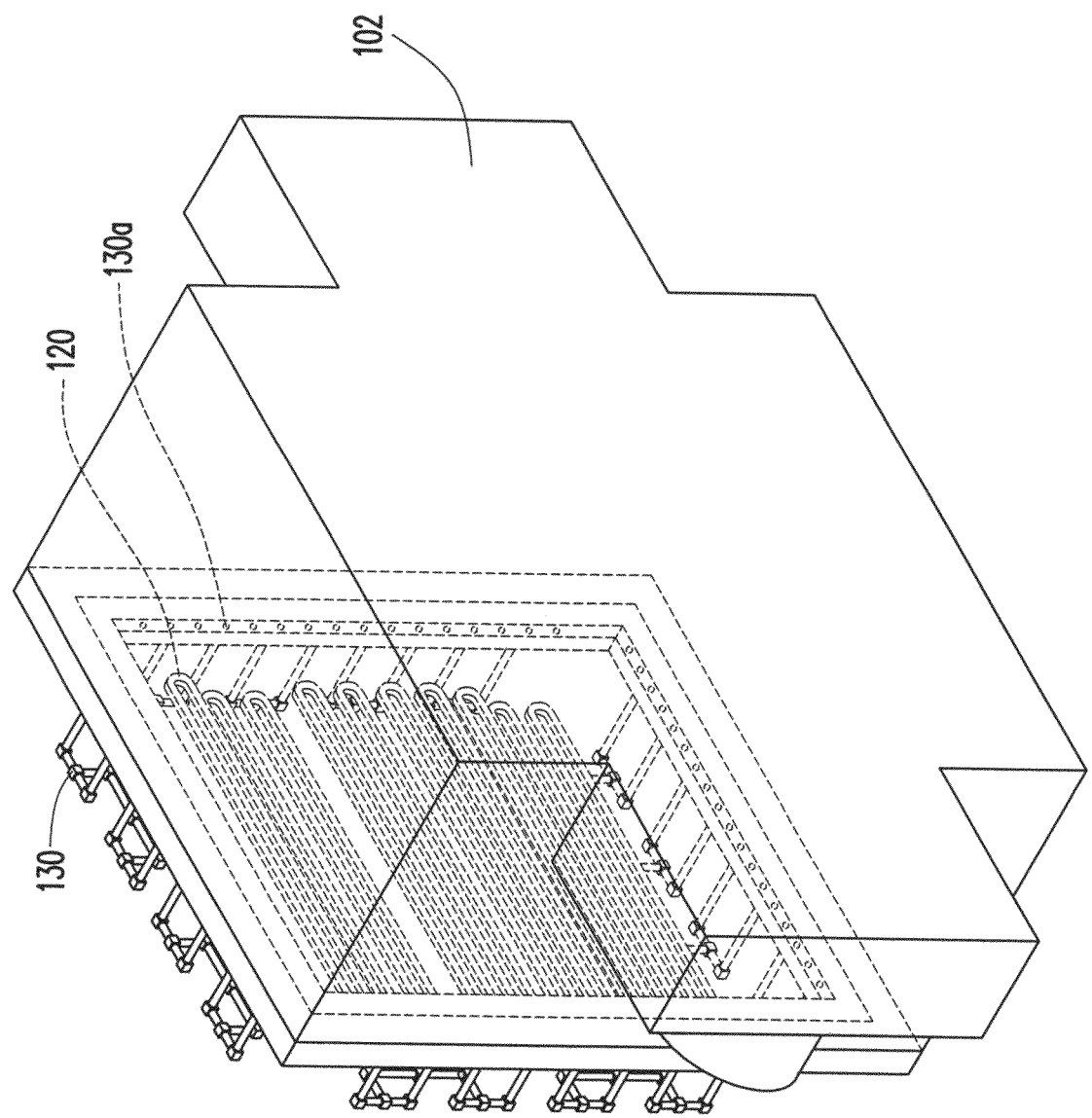
FIG. 3 is a 3-dimensional diagram showing the top portion of a plasma excitation module according to an embodiment of the present invention.
Figure 4:
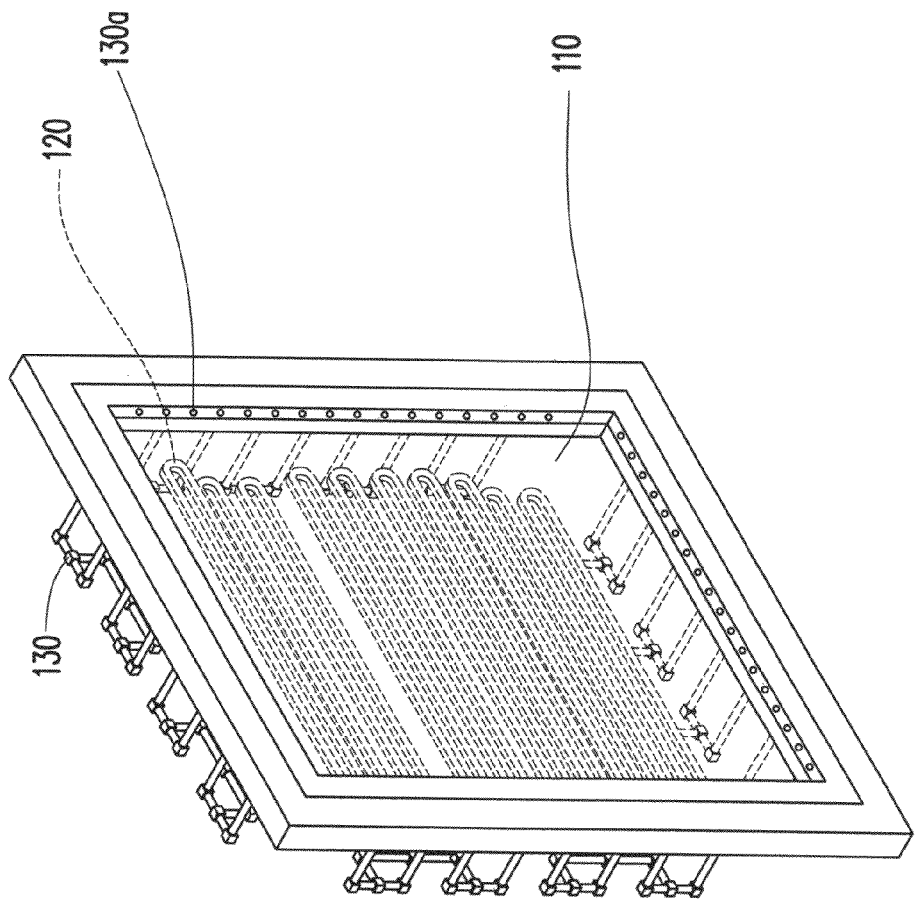
FIG. 4 is a localized perspective diagram in which the chamber shown in FIG. 3 is hidden.

FIG. 2 is a 3-dimensional diagram showing the bottom portion of a plasma excitation module according to an embodiment of the present invention. FIG. 3 is a 3-dimensional diagram showing the top portion of a plasma excitation module according to an embodiment of the present invention. For depiction convenience, only the chamber, dielectric layer, coils and multi-duct gas intake system are shown in FIGS. 2 and 3. FIG. 4 is a localized perspective diagram in which the chamber shown in FIG. 3 is hidden.

Referring to FIGS. 1, 2, 3 and 4, there is an opening 104 disposed at the bottom of the chamber 102, and the opening 104 serves as a gas inlet and for disposing the inductive coils. The material of the chamber 102 is, for example, metal. The dielectric layer 110 covers the opening 104 to form a wall of the chamber 102. The upper surface of the dielectric layer 110 directly contacts the vacuum in the chamber 102, and the lower surface thereof contacts the atmosphere. The material of the dielectric layer 110 is, for example, quartz glass or ceramic. The coils 120 are in parallel connection and disposed outside the chamber 102, i.e., the coils 120 are disposed on the lower surface of the dielectric layer 110 at the atmosphere. The material of the coils 120 is, for example, metal such as aluminium or copper. The ducts of the multi-duct gas intake system 130 are disposed, for example, under the coils

120 and surround the dielectric layer 110. The ends of the ducts of the multi-duct gas intake system 130 respectively have a plurality of gas outlets 130a, which are disposed, for example, over the dielectric layer 110 at the side close to the chamber 102 so that the multi-duct gas intake system 130 is communicated with the chamber 102.

Figure 5:
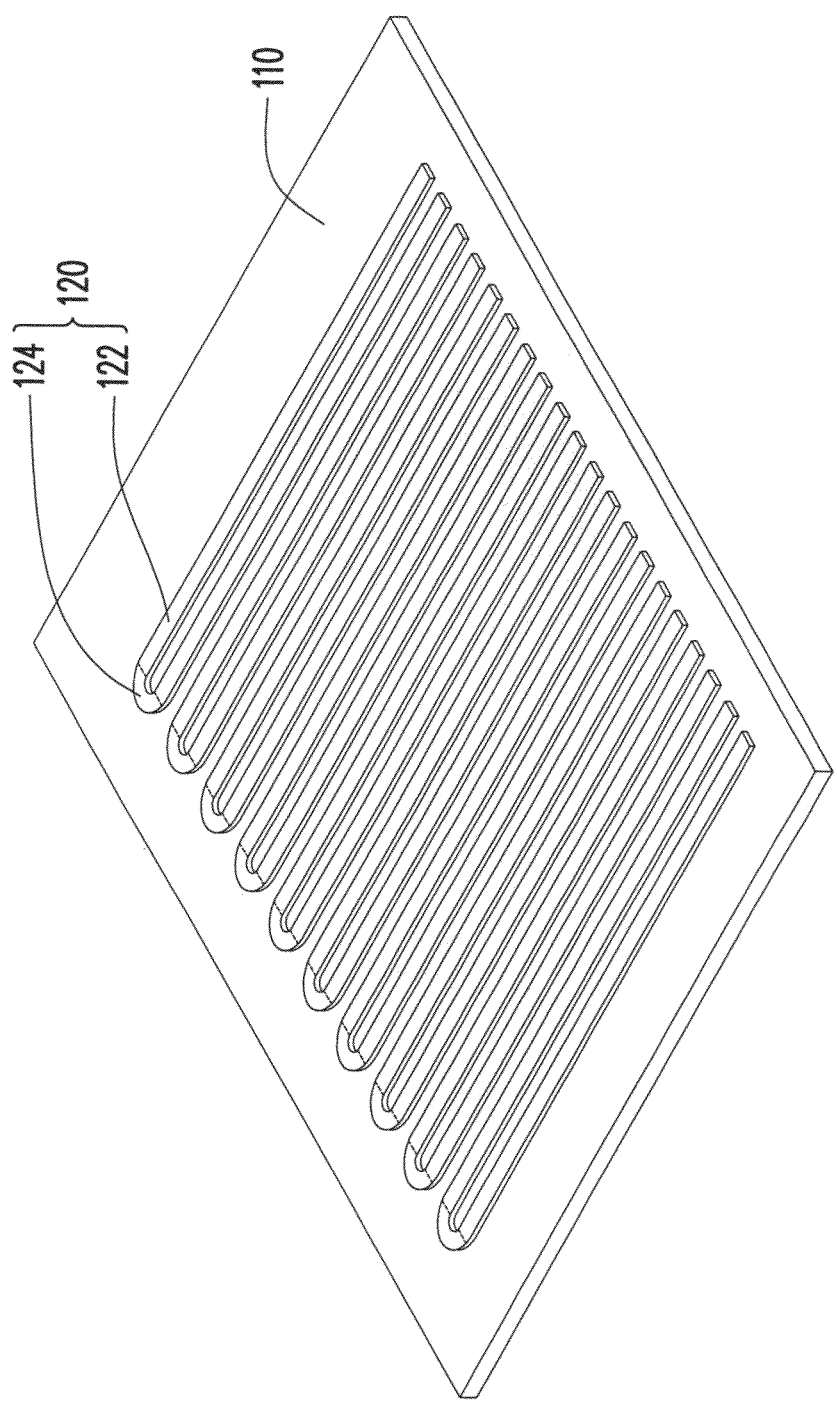
FIG. 5 is a schematic bottom view showing the disposition of a dielectric layer and coils according to an embodiment of the present invention.
Figure 6A:
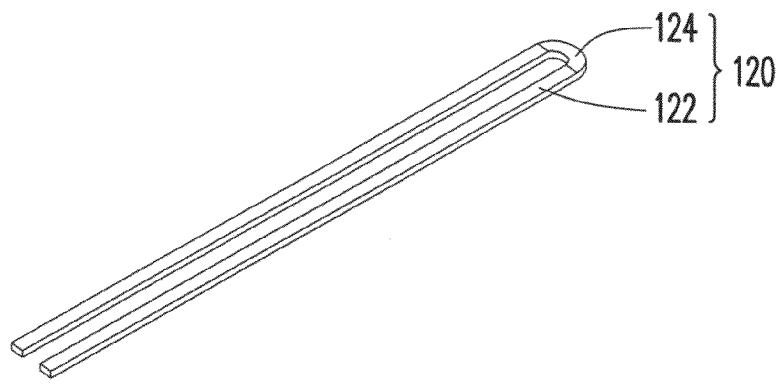
FIGS. 6A-6C respectively are diagrams of coils according to an embodiment of the present invention.
Figure 6B:
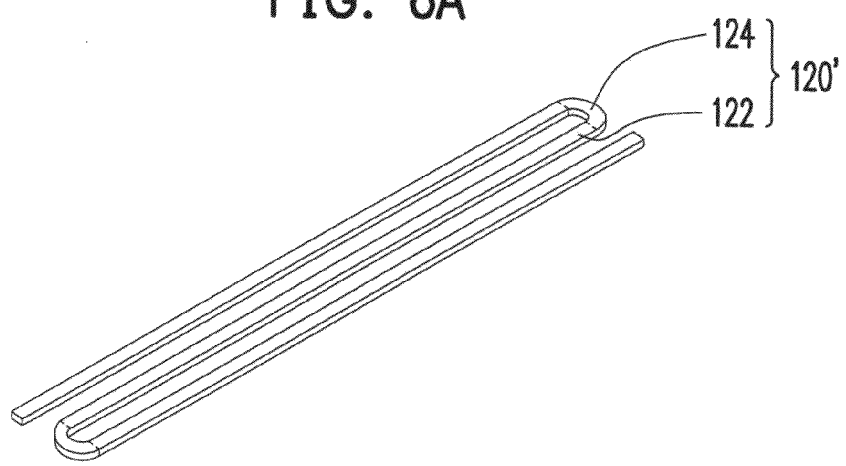
Figure 6C:
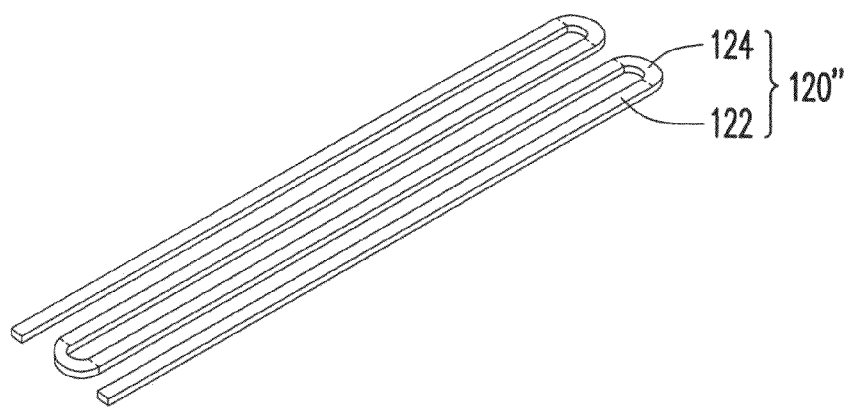

FIG. 5 is a schematic bottom view showing the disposition of a dielectric layer and coils according to an embodiment of the present invention. FIGS. 6A-6C respectively are diagrams of coils according to an embodiment of the present invention.

Referring to FIG. 5, the coils 120 are disposed in parallel connection, wherein each of the coils 120 includes linear bodies 122 and a connector 124, and the connector 124 connects the adjacent two linear bodies 122. The two linear bodies 122 can be parallel or non-parallel to each other. The connector 124 has, for example, a bending contour. In more details, a plurality of linear bodies 122 are arranged at the same side of the dielectric layer 110 contacting the atmosphere, and each connector 124 makes, for example, at least two adjacent linear bodies 122 in series connection so as to form a single coil structure.

In an embodiment, as shown by FIG. 6A, a single coil 120 can be a U-shaped coil formed by a connector 124 and two linear bodies 122 in series connection. In another embodiment, as shown by FIG. 6B, a single coil 120' can be a coil formed by two connectors 124 and three linear bodies 122 in series connection. In further another embodiment, as shown by FIG. 6C, a single coil 120" can be a coil formed by three connectors 124 and four linear bodies 122 in series connection, and the coil 120" can be seen as two U-shaped coils 120 as shown by FIG. 6A together in series connection. In other embodiments, the connector 124 can have an unbending contour, for example, a V-shaped, so that the two linear bodies 122 connected in series by the V-shaped connector 124 convert into a V-shaped coil, which the present invention is not limited to.

In addition, the distance between each of the coils 120 and the dielectric layer 110 can be equal or not equal to each other. For a same applied high-frequency voltage, the shorter the distance between the coil 120 and the dielectric layer 110, the greater the electric field intensity inducted in the chamber 102 is; the longer the distance between the coil 120 and the dielectric layer 110, the less the electric field intensity inducted in the chamber 102 is. Considering all the coils 120 are parallel to each other and in parallel connection, the inducted electric field intensity at a specific area can be changed by adjusting the distance between an individual coil 120 and the dielectric layer 110, which further enhances the uniformity of the plasma. In other words, the distance between an individual coil 120 and the dielectric layer 110 can be adjusted to meet a special requirement. Since the coils 120 are disposed at the side contacting the atmosphere, the position of a single coil 120 can be easily adjusted to make the electric field more uniform.

Figure 7A:
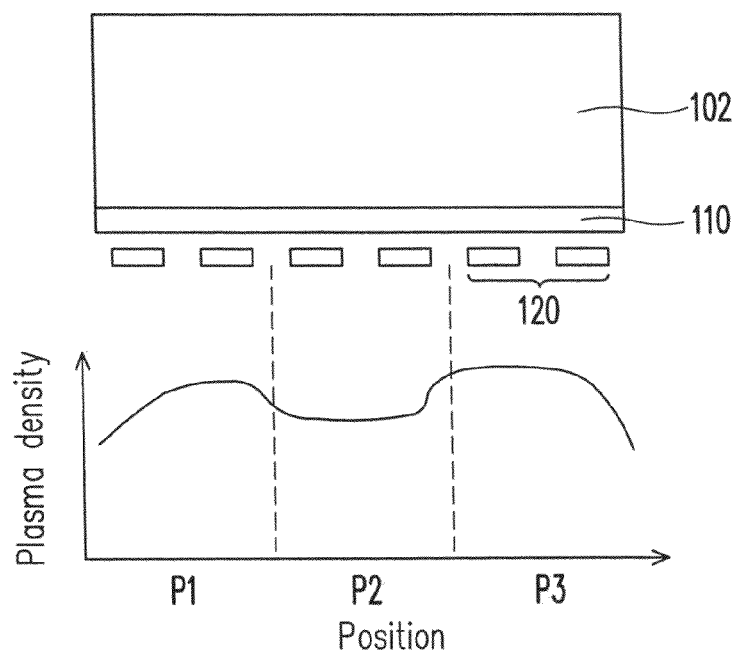
FIGS. 7A and 7B are diagrams showing the relationship between the coil disposition and the corresponding plasma density according to an embodiment of the present invention.
Figure 7B:
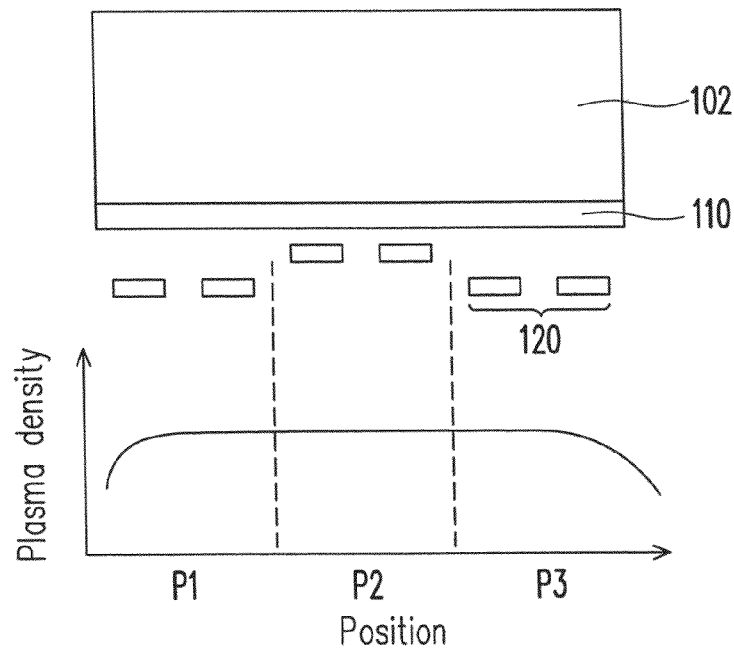

FIGS. 7A and 7B are diagrams showing the relationship between the coil disposition and the corresponding plasma density according to an embodiment of the present invention. It should be noted that the relationships illustrated in FIGS. 7A and 7B are examples only for explaining the effect of the invented scheme by adjusting the distance between each individual coil 120 and the dielectric layer 110 and thereby facilitating the implementation of the embodiment, which the present invention is not limited to.

In an example, as shown by FIG. 7A, when the distances between every coil 120 and the dielectric layer 110 are the same, a larger plasma density is measured respectively at two border positions P1 and P3 of the two sides, but a less electric field is measured at the center position P2. The corresponding disposition of the coils 120 shown in FIG. 7A results in ununiform plasma distribution. On the other hand, as shown by FIG. 7B, after adjusting the deployment of the coils 120 at the border positions P1 and P3, the distances between the coils 120 and the dielectric layer 110 at the positions P1 and P3 are longer than that at the position P2, so that a more uniform plasma density distribution is obtained. In more details, the longer the distances between the coils 120 at the positions P1 and P3 and the dielectric layer 110, the less the inducted electric field intensity in the chamber 102 is, which reduces the plasma density at the positions P1 and P3 to the extent close to the plasma density at the position P2.

Since the plasma density is closely related to the electric field intensity, so that the intervals between the coils are critical to obtain a good distribution of electric field intensity. The planar coil structure provided by an embodiment of the present invention is advantageous in simple structure and easily processing, and the invented coil structure including a plurality of coils in parallel connection can avoid standing wave effect. Coil architecture in a larger area using the structure of the parallel coils is able to be realized by adjusting the amount of the individual coil, which can meet the demand for a large-scaled plasma excitation module, such as a large-scaled display.

Figure 8:
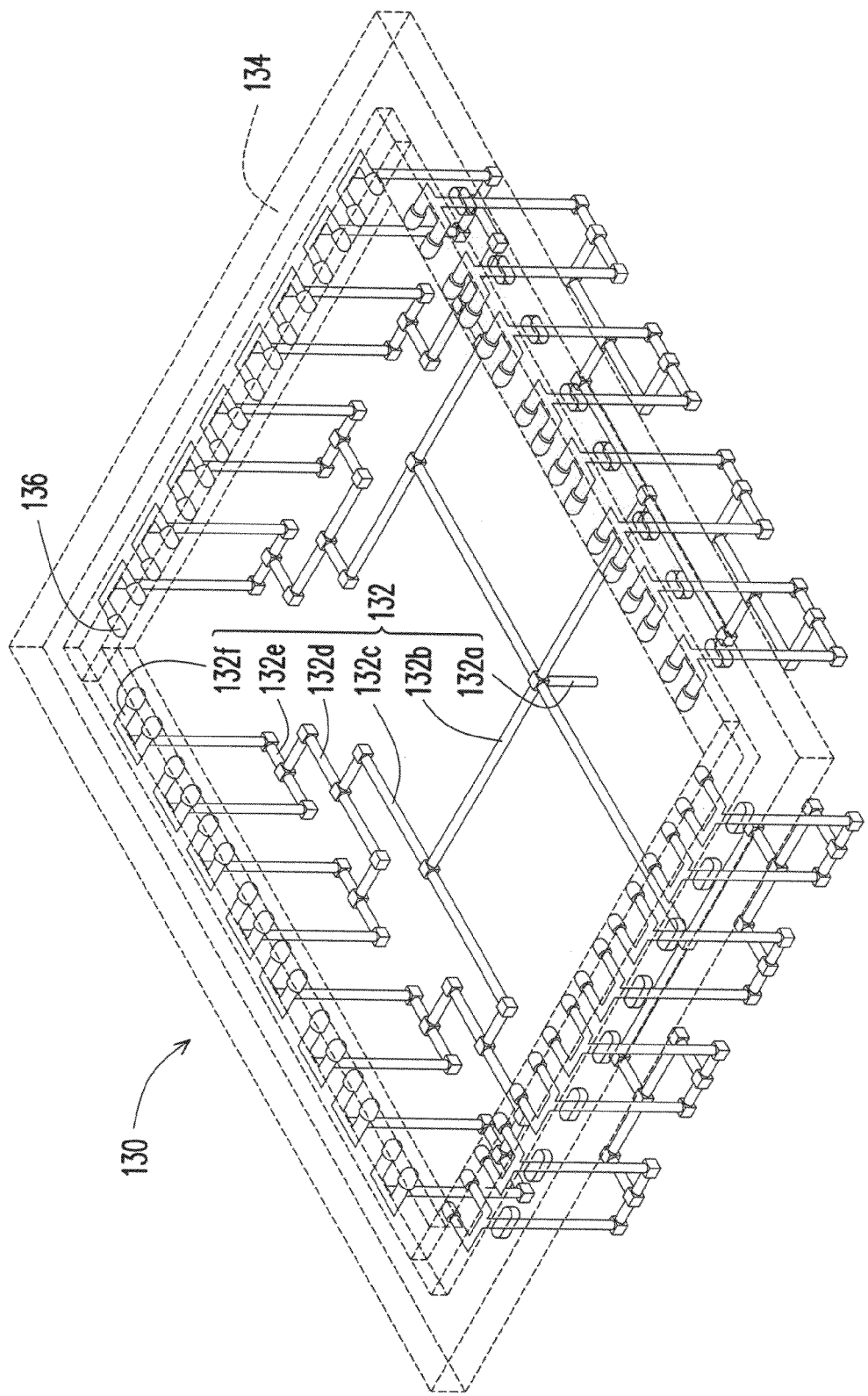
FIG. 8 is a 3-dimensional diagram of a multi-duct gas intake system according to an embodiment of the present invention.
Figure 9:
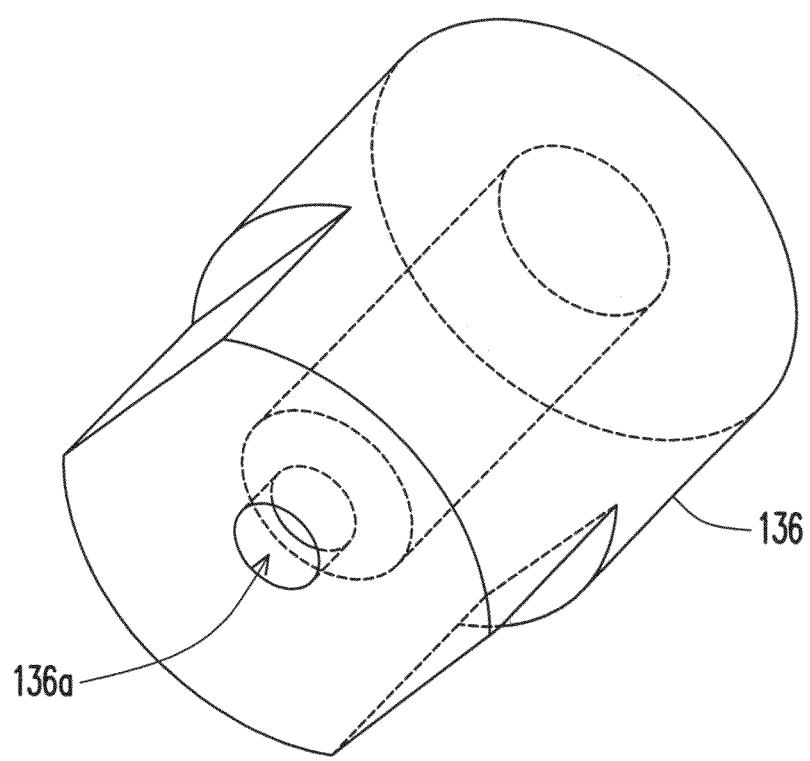
FIG. 9 is a 3-dimensional diagram of a nozzle according to an embodiment of the present invention.

FIG. 8 is a 3-dimensional diagram of a multi-duct gas intake system according to an embodiment of the present invention. FIG. 9 is a 3-dimensional diagram of a nozzle according to an embodiment of the present invention.

Referring to FIG. 8, the multi-duct gas intake system 130 includes a gas intake duct 132, a gas intake interface 134 and a plurality of nozzles 136. The gas intake interface 134 is, for example, a frame to connect the gas intake duct 132. The gas intake interface 134 is disposed, for example, between the dielectric layer (not shown) and the chamber (not shown). The nozzles 136 are disposed in the gas intake interface 134 and connect the gas intake duct 132 so as to make the gas intake duct 132 communicated with the chamber. The nozzle 136 has, for example, a gas outlet 136a (as shown in FIG. 9) with an adjustable aperture. By adjusting the aperture size of the gas outlet 136a, the flow speed of the ejected gas can be altered. In this way, the adjustable aperture can serve for fine adjusting the uniformity of the gas field. The material of the multi-duct gas intake system 130 is, for example, metal.

The gas intake duct 132 includes a main duct 132a and a plurality of branch ducts 132b, 132c, 132d, 132e, 132f. The main duct 132a connects, for example, the gas-supplying system 140 so that the process gas provided by the gas source 142 can flow into the chamber 102 through the gas intake duct 132. The outlet end of each of the branch ducts 132f respectively connects a nozzle 136.

In an embodiment, as shown in FIG. 8, the main duct 132a is located in the center and connects with the branch ducts 132b in four directions; each of the branch ducts 132b connects with two branch ducts 132c; each of the branch ducts 132c connects with two branch ducts 132d; each of the branch ducts 132d connects with two branch ducts 132e; each of the branch ducts 132e connects with two branch ducts 132f; and each of the branch ducts 132f respectively connects with a nozzle 136. When the process gas provided by the gas source 142 arrives at the main duct 132a, the gas would evenly distribute into the branch ducts 132b, followed by successively and evenly distributing the gas to the branch ducts 132c, 132d, 132e, 132f from each of the branch ducts 132b. After several evenly dividing the gas, a same portion of the gas flows from each of the branch ducts 132f into the chamber through the respective nozzles 136. It should be noted that the length of each flowing path of the gas is the same as each other. In other words, any flowing distance for the gas to successively pass through from the main duct 132a to the nozzle 136 through the branch ducts 132b, 132c, 132d, 132e and 132f is the same as each other.

By using the above-mentioned even hierarchy of the gas intake duct 132 where every flowing path from the main duct 132a up, sequentially through the branch ducts 132b, 132c, 132d, 132e, 132f, to the nozzle 136 as the end of a duct chain is the same as each other, the progressive multi-hierarchy benefits achieving a uniform gas field. In addition, in the embodiment shown in FIG. 8, each branch duct is split into two next-grade branch ducts only, instead of taking a single-hierarchy architecture (that is, the gas flows directly from a single duct into the chamber through a plurality of nuzzles). Although the number of the nuzzles in the single-hierarchy architecture can be designed as the same as the nuzzles 136 in the multi-hierarchy architecture of the present invention, the invented hierarchy can make the gas volume ejected from each nuzzle more even due to the graded branch ducts.

In particular, considering the plasma density is related to the uniformity of the gas field. The diffusion effect of the plasma is poor under a higher barometric pressure causes, and therefore, the distributions of both the gas field and the electric field must be uniform in order to obtain even plasma density. The multi-duct gas intake system in an embodiment of the present invention features in the multi-hierarchy architecture of the multi-duct gas intake system. Besides, the aperture diameters of the nuzzles at different positions can be adjusted in accordance with a gas field simulation, and the gas discharged from each nozzles at the different positions can be further fine adjusted for producing a more even gas field. In short, the present invention takes the multi-duct gas intake system as a gas-feeding system with more even distribution of gas field, thereby producing more even plasma density.

FIG. 10 is a 3-dimensional diagram showing the bottom portion of a plasma excitation module according to another embodiment of the present invention.

Referring to FIG. 10, in an embodiment, the plasma excitation module 100 further includes a dielectric layer support plate 112. The dielectric layer support plate 112 is disposed under the chamber 102, such that the dielectric layer 110 and the gas intake interface 134 are pressed between the chamber 102 and the dielectric layer support plate 112. The dielectric layer support plate 112 herein fixes the dielectric layer 110 and the multi-duct gas intake system 130 on the chamber 102, so that the chamber 102 is airtight, i.e., the reactant gas in the chamber 102 is isolated from the atmosphere outside. In an embodiment, the dielectric layer support plate 112 is a frame to cover the borders of the dielectric layer 110. The material of the dielectric layer support plate 112 is, for example, metal.

Anyone skilled in the art should understand that the above-mentioned sets of coils in parallel connection and the multi-duct gas intake system can be independently applied to other plasma excitation modules for promoting the uniformity of electric field or gas field as required. In other words, it is not necessary to take the above-mentioned deploying manner where the sets of coils in parallel connection and the multi-duct gas intake system are disposed in a single plasma excitation module.

To verify the effects of improving the plasma uniformity by using the invented plasma excitation module, several experiments and the results thereof are given in the following. The experiments are designed to indicate the influence of the coil dispositions on the electric field and the influence of the multi-duct gas intake system on the gas field. However, the present invention is not limited to the given experiment results.

EXAMPLES

Figure 11A:
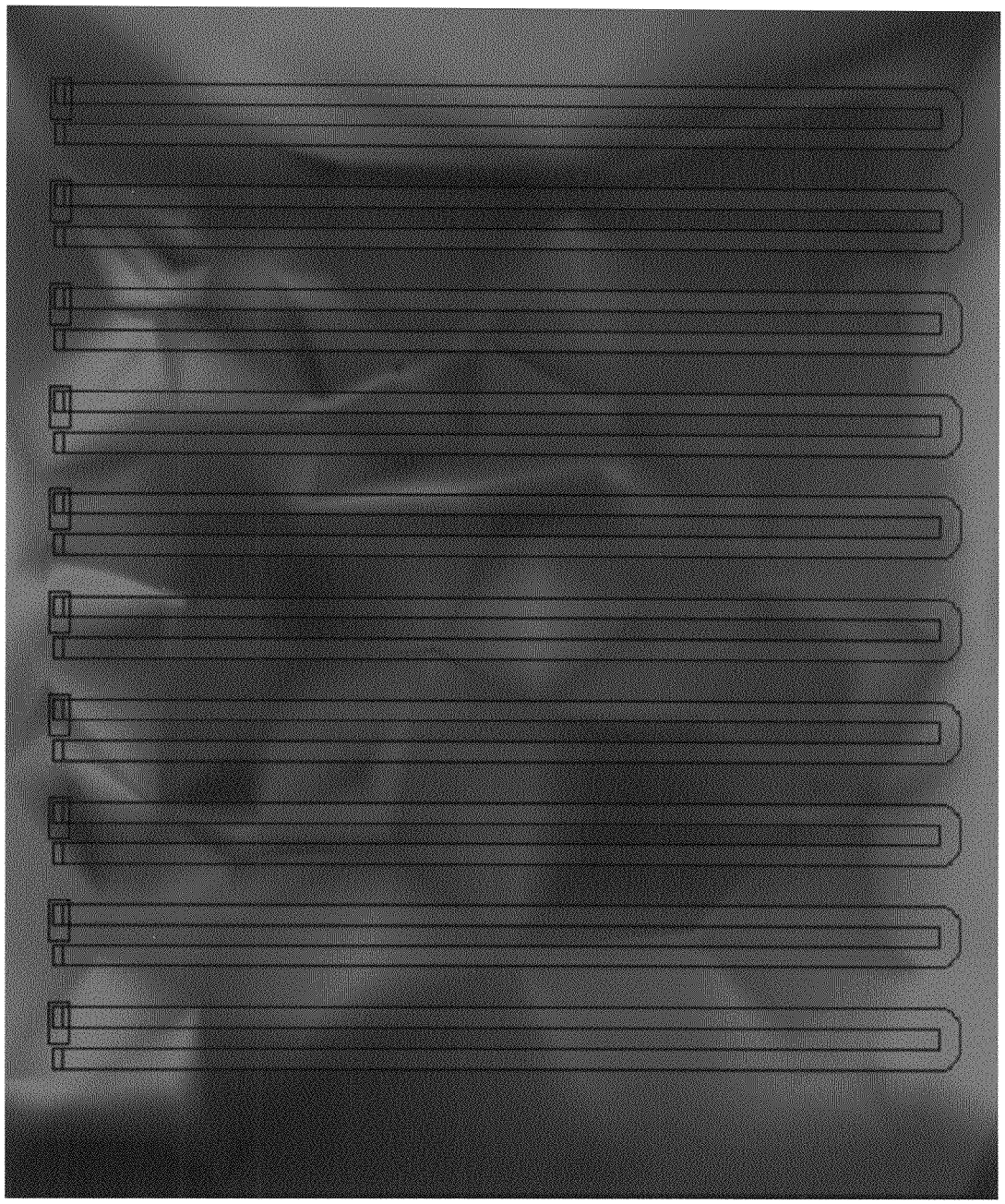
FIGS. 11A-11C are distribution diagrams of the electric fields corresponding to different coil dispositions.
Figure 11B:
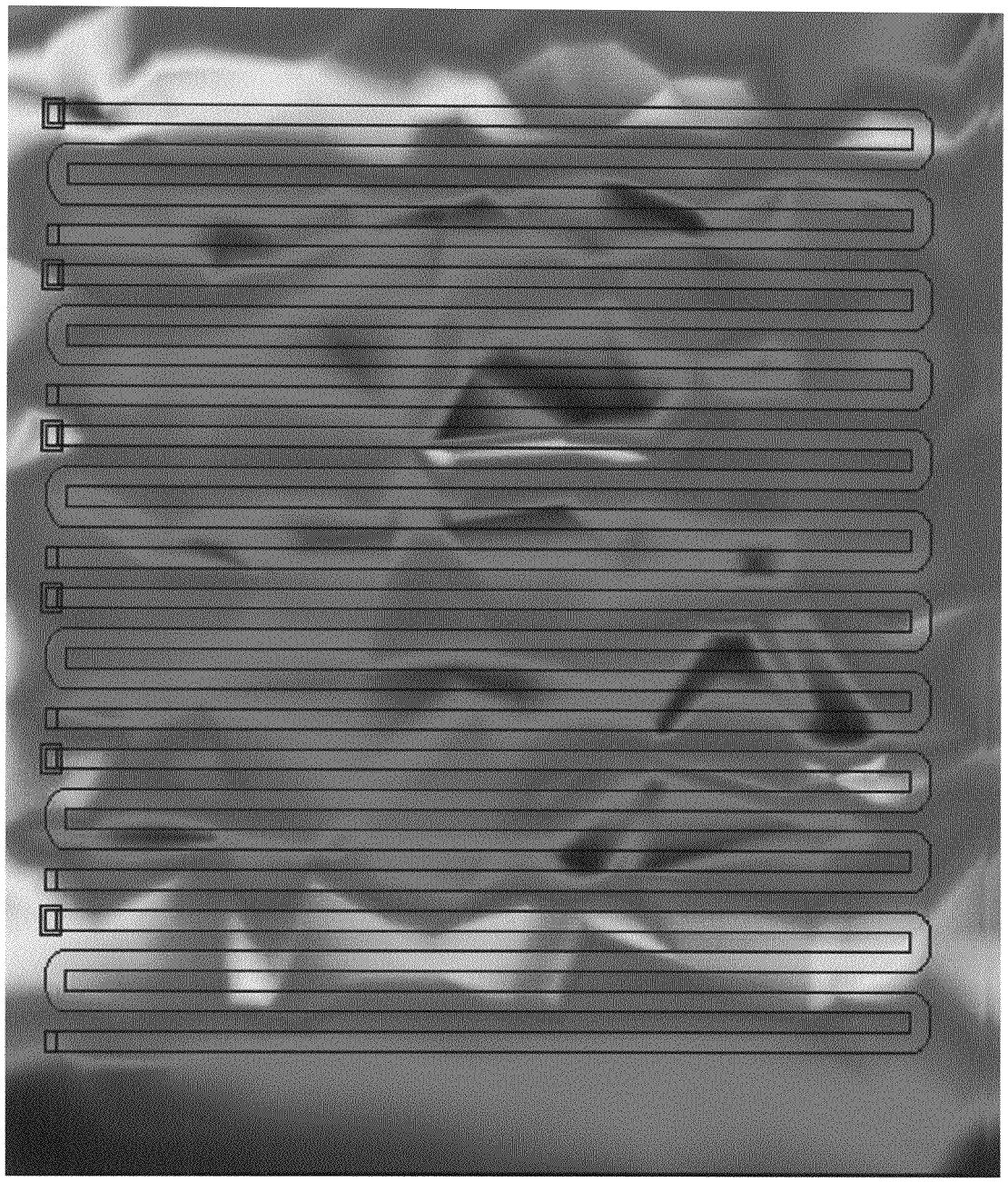
Figure 11C:
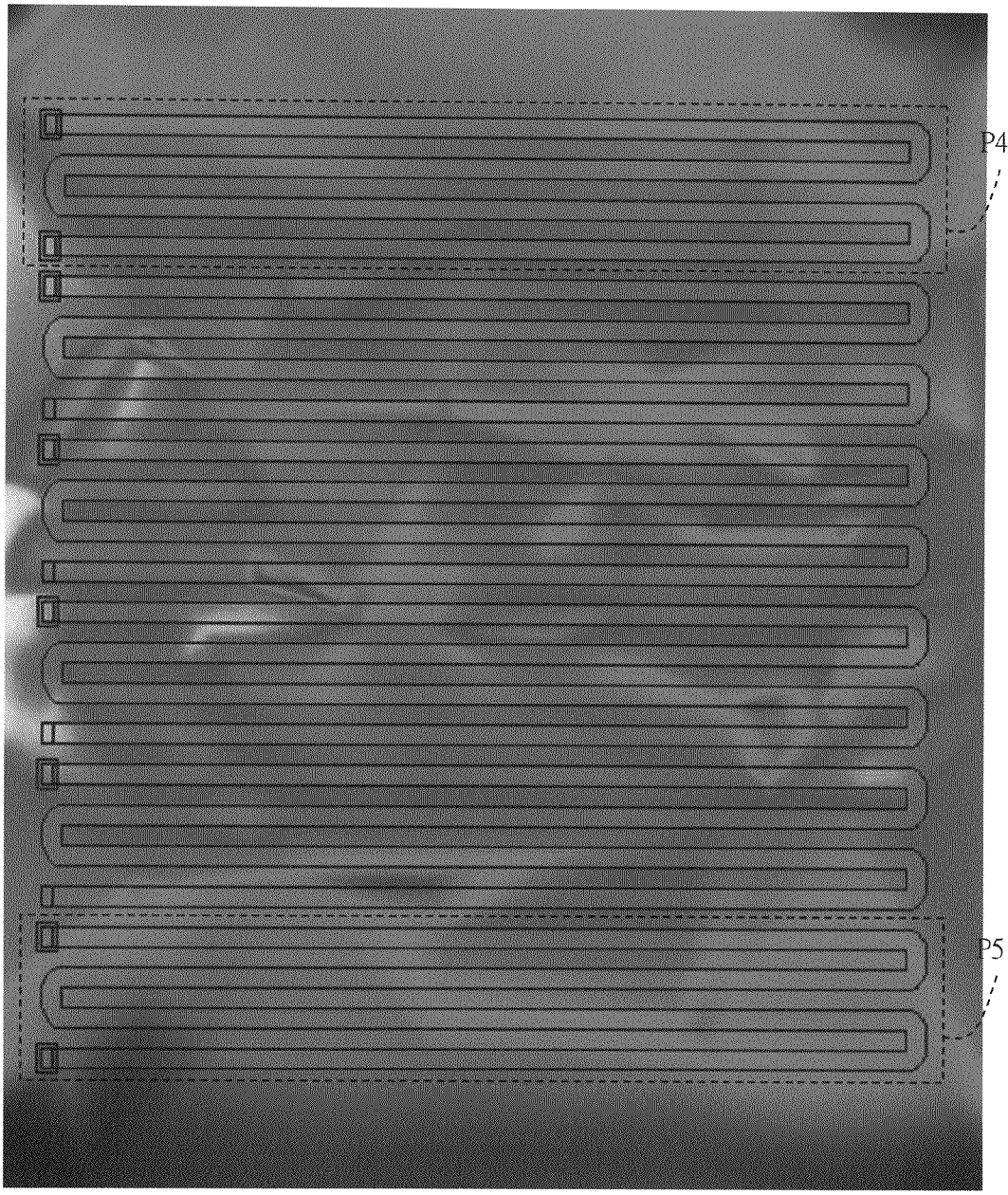

FIGS. 11A-11C are distribution diagrams of the electric fields corresponding to different coil dispositions.

It is noted that various colors shown in FIGS. 11A-11C represent diverse intensity degrees of electric field, respectively. Referring to FIG. 11A, a uniform distribution of electric field based on the color can be observed when a plurality of single U-shaped coils (as shown by FIG. 6A) is employed in the plasma excitation module. In FIG. 11B, a uniform distribution of electric field is also shown by the color configuration when two sets of U-shaped coils in series connection (as shown by FIG. 6C) are employed in the coil structure of the plasma excitation module.

As shown by FIG. 11C, when the distances between the coils and the dielectric layer are set longer at the border positions P4 and P5 (similar to the deployment demonstrated in FIG. 7B), a further improved uniformity of electric field is obtained where the coil structure employed in the plasma excitation module is designed as two sets of U-shaped coils in series connection. As compared with the respective distribution of electric field shown in FIG. 11B, the inducted electric field intensity at the border positions P4 and P5 shown in FIG. 11C is reduced due to the longer distance between the coils and the dielectric layer, thereby achieving substantially even electric field.

Figure 12A:
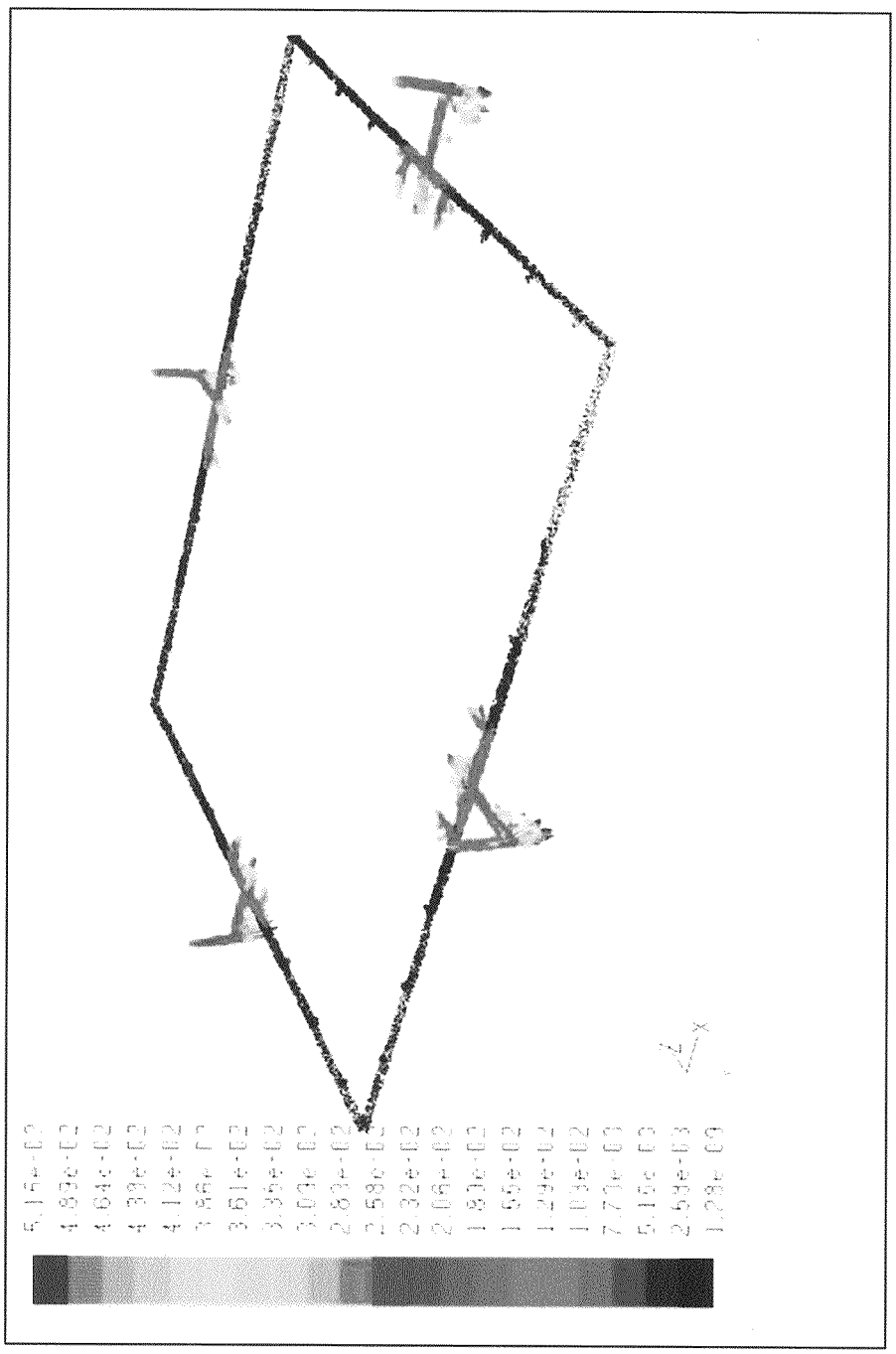
FIGS. 12A-12B are distribution diagrams of the gas volumes corresponding to different branch dispositions of gas intake ducts.
Figure 12B:
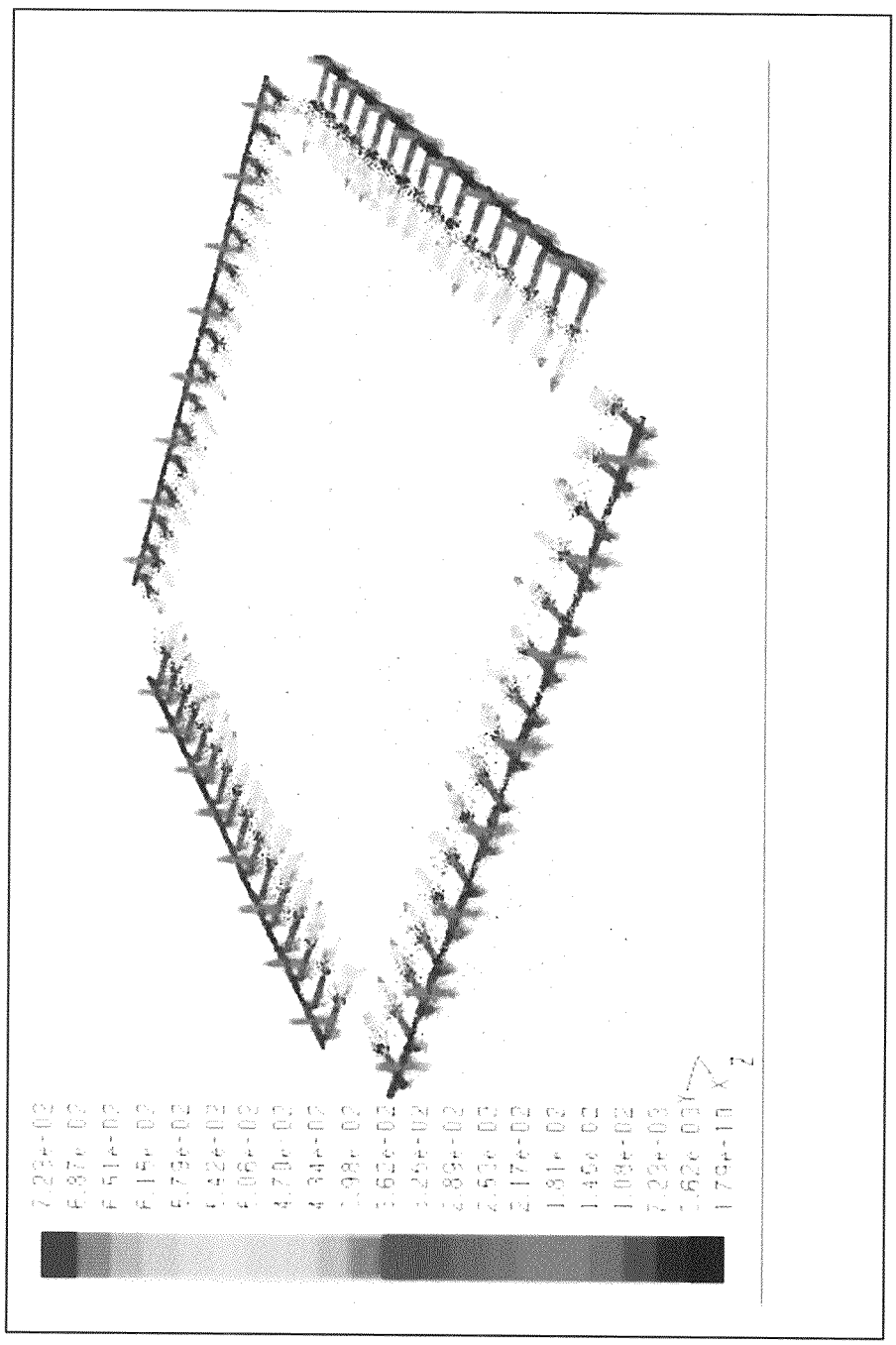
Figure 12C:
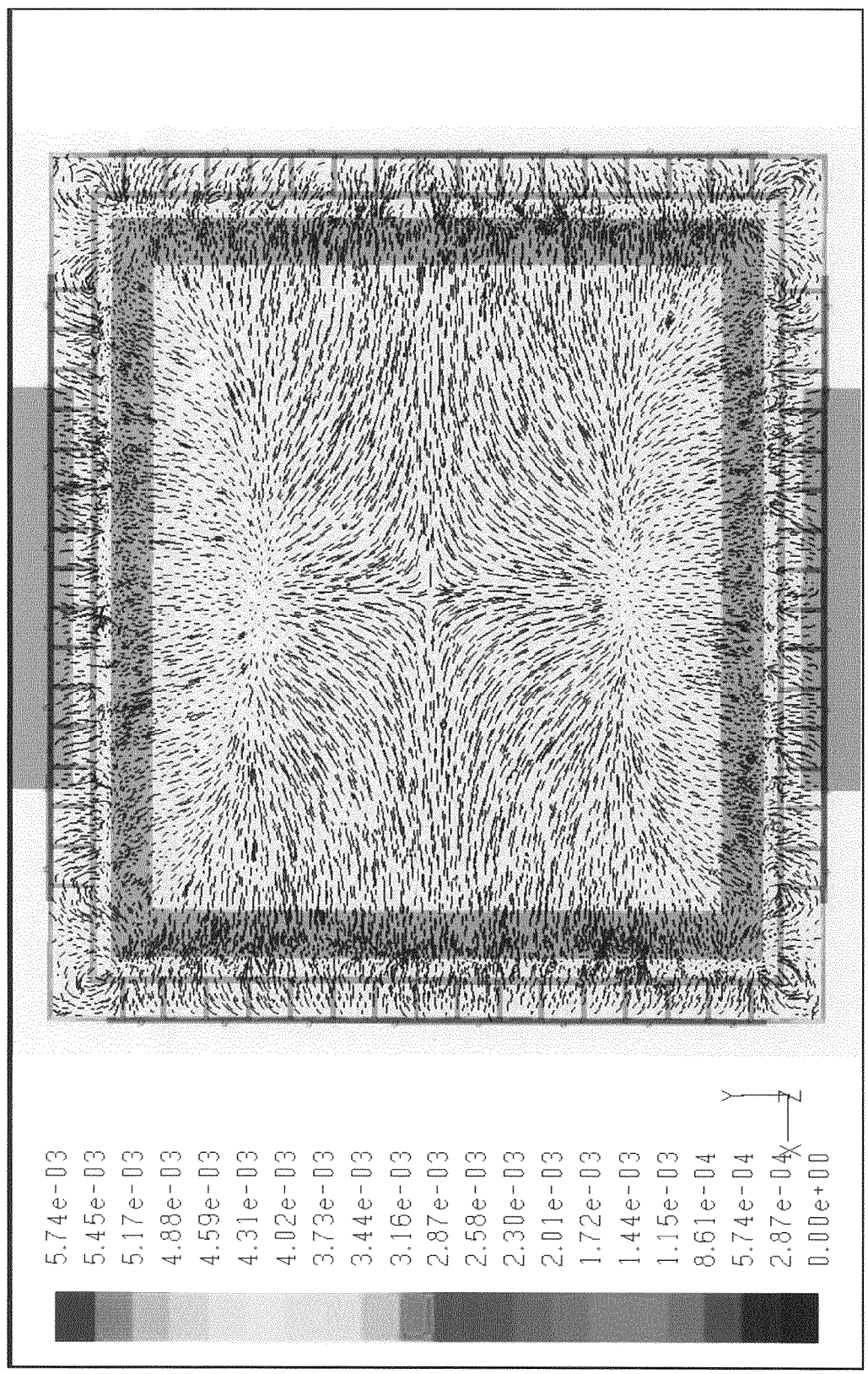
FIG. 12C is a distribution diagram of the gas field corresponding to the branch disposition of gas intake ducts as shown in FIG. 12B.

FIGS. 12A-12B are distribution diagrams of the gas volumes corresponding to different branch dispositions of gas intake ducts. FIG. 12C is a distribution diagram of the gas field corresponding to the branch disposition of gas intake ducts as shown in FIG. 12B.

As shown by FIG. 12A, the gas intake duct includes a main duct and four branch ducts extended in four directions and connected by the main duct, wherein each of the branch ducts is further split into eight gas outlets. The experimental result indicates that a greater volume of gas discharged from the gas outlet is distributed mostly at the center position. In other words, the said branch disposition of the gas intake duct makes the gas flowing from the branch ducts to the gas outlets more concentrated at the gas outlets closer to the branch ducts, which results in ununiform gas discharge.

In FIG. 12B however, the branch disposition of the gas intake duct in this experimental example is the same as the multi-duct gas intake system shown in FIG. 8 where the main duct connects four branch ducts extended in four directions. Each of the branch ducts is evenly split into two branch ducts until there are 16 branch ducts respectively at all the four directions. The end of each of the branch ducts solely connects a nuzzle serving as a gas outlet. From the result, it can be seen that an almost same gas volume is discharged from each gas outlet; therefore, the branch disposition of the gas intake duct as shown by FIG. 12B can make the distribution of gas discharge more uniform.

In FIG. 12C, a more uniform distribution of the gas field corresponding to the branch disposition of the gas intake duct of FIG. 12B is illustrated, which verifies the efficacy of the improved gas intake system for the plasma excitation module in the present invention.

Overall, the above-mentioned experimental results indicate the coil disposition and the multi-duct gas intake system provided by the embodiment of the present invention are able to make both the electric field and the gas field more uniform. As a result, the plasma excitation module employing the coil disposition and the multi-duct gas intake system of the above-mentioned embodiment can produce more uniform plasma.

In summary, the plasma excitation module of the present invention using a planar coil structure in parallel connection is advantageous in simple structure and easily processing. A plurality of the coils structured in parallel connection can avoid standing wave effect. Since a plurality of coils are disposed in parallel connection, the distance between an individual coil and the dielectric layer can be adjusted, which accordingly adjusts the electric field intensity at certain positions to obtain more uniform plasma distribution. In addition, coil architecture with a larger area can be realized by increasing the number of the coils in parallel connection, which can meet the demand for a large-scaled inductively coupled plasma (ICP), such as a large-scaled display.

Moreover, the plasma excitation module of the present invention uses a multi-duct gas intake system to realize progressive multi-duct gas intake architecture, which benefits producing a distribution of gas field to make the plasma density more uniform. Since the end of each of the branch ducts solely connects a nozzle and the gas outlet aperture of the nozzle is adjustable, the gas discharged from each nozzle at different positions can be fine adjusted to produce more uniform gas field.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A plasma excitation module, comprising:
a chamber, having a single dielectric layer;
a plurality of coils, disposed at an outer side of the dielectric layer of the chamber, wherein the coils are disposed in parallel connection; and
a multi-duct gas intake system, surrounding the dielectric layer and communicated with the chamber, wherein a normal direction of the coils is perpendicular to a gas intake direction of the multi-duct gas intake system,
wherein the multi-duct gas intake system comprises:
a gas intake duct, comprising:
a main duct; and
a plurality of branch ducts, connecting the main duct;
a gas intake interface, connecting the gas intake duct, wherein the gas intake interface is disposed between the dielectric layer and the chamber; and
a plurality of nozzles, disposed in the gas intake interface to make the gas intake duct communicated with the chamber, wherein an outlet end of each of the branch ducts is connected to each of the nozzles,
wherein the branch ducts comprises:
four first branches, connecting the main duct; and
a plurality of second branches, third branches until N-th branches, wherein N is a positive integer less than 1000, each of the second branches connects an outlet end of each respective first branch and an inlet end of each respective third branch, each of the (N−1)-th branches connects an outlet end of each respective (N−2)-th branch and an inlet end of each respective N-th branch and each of the N-th branches connects an outlet end of each respective (N−1)-th branch and each respective nozzle, wherein N is a positive integer, wherein each first branch connects to two second branches, each second branch connects to two third branches, and each of the (N−1)-th branches connects to two N-th branches.

2. The plasma excitation module as claimed in claim 1, wherein each of the coils comprises:
at least two linear bodies; and
a connector, connecting adjacent two linear bodies.

3. The plasma excitation module as claimed in claim 2, wherein each of the linear bodies is parallel to or non-parallel to each other.

4. The plasma excitation module as claimed in claim 2, wherein the connector has a bending contour or an unbending contour.

5. The plasma excitation module as claimed in claim 1, wherein a distance between each coil and the dielectric layer is adjustable.

6. The plasma excitation module as claimed in claim 1, wherein a gas outlet aperture of each of the nozzles is adjustable.

7. The plasma excitation module as claimed in claim 1, wherein an amount of the N-th branches connected by each of the (N−1)-th branches is equal to each other.

8. The plasma excitation module as claimed in claim 1, wherein a length of each of the branch ducts is the same as each other.

9. The plasma excitation module as claimed in claim 1, further comprising a dielectric layer support plate to fix the dielectric layer onto the chamber.

10. The plasma excitation module as claimed in claim 1, further comprising a gas-supplying system, which is connected to the multi-duct gas intake system.

11. The plasma excitation module as claimed in claim 10, wherein the gas-supplying system comprises a gas source and a mass flow controller, wherein the mass flow controller is disposed between the multi-duct gas intake system and the gas source.

12. The plasma excitation module as claimed in claim 1, further comprising a power supply system, connecting the coils.

13. The plasma excitation module as claimed in claim 12, wherein the power supply system comprises a high-frequency power source and an impedance matching circuit, wherein the impedance matching circuit is disposed between the coils and the high-frequency power source.

14. The plasma excitation module as claimed in claim 1, further comprising a vacuum pumping system, which is connected to the chamber.

15. The plasma excitation module as claimed in claim 14, wherein the vacuum pumping system comprises a vacuum pump and an exhaust pipe, and the exhaust pipe is disposed between the chamber and the vacuum pump.

16. The plasma excitation module as claimed in claim 1, wherein the material of the coils is aluminium or copper.

17. The plasma excitation module as claimed in claim 1, wherein a material of the dielectric layer is quartz glass or ceramic.

* * * * *